United States Patent [19]
Stitt et al.

[11] Patent Number: 5,130,572
[45] Date of Patent: Jul. 14, 1992

[54] OPERATIONAL TRACK-AND-HOLD AMPLIFIER

[75] Inventors: Robert M. Stitt; David J. Kunst, both of Tucson, Ariz.

[73] Assignee: Burr-Brown Corporation, Tucson, Ariz.

[21] Appl. No.: 633,078

[22] Filed: Dec. 26, 1990

[51] Int. Cl.[5] ............................................. H03K 5/159
[52] U.S. Cl. .................................................... 307/353
[58] Field of Search ......................... 307/353; 328/151

[56] References Cited

U.S. PATENT DOCUMENTS

| | | | |
|---|---|---|---|
| 3,838,346 | 9/1974 | Cox | 328/151 |
| 4,370,572 | 1/1983 | Cosand et al. | 307/353 |
| 4,779,012 | 10/1988 | Moscovici | 307/353 |
| 4,806,790 | 2/1989 | Sone | 307/353 |
| 4,845,382 | 7/1989 | Eouzan et al. | 307/353 |
| 5,015,877 | 5/1991 | King | 307/353 |

OTHER PUBLICATIONS

Delarue et al., "Control Circuit for Sample-and-Hold Devices", *IBM Technical Disclosure Bulletin*, vol. 19; No. 11 Apr. 1977, pp. 4211, 4212.

Primary Examiner—James B. Mullins
Attorney, Agent, or Firm—Antonio R. Durando; Harry M. Weiss

[57] ABSTRACT

A track-and-hold circuit that consists of an operational amplifer wherein the same capacitors are used for phase compensation and as differential holding capacitors. The circuit is switched from track to hold by turning off the input stage by reverse biasing base-emitter junctions through current steering in combination with resistor clamping. Low impedance during the hold mode is maintained because one half of the differential compensation path is connected to the output. Feed-through is eliminated by cascoding the first stage and turning off the cascode devices through current steering with resistor clamping during the holding mode. The holding capacitors' droop due to bias currents is minimized by current cancellation of the second stage.

17 Claims, 5 Drawing Sheets fig. 1 (PRIOR ART)

fig. 2 fig. 3 fig. 4 fig. 5 fig. 6

OPERATIONAL TRACK-AND-HOLD AMPLIFIER

BACKGROUND OF THE INVENTION

1. Field of the Invention

This invention pertains to the general field of track-and-hold and sample-and-hold amplifiers. In particular, it provides a new track-and-hold amplifier circuit which utilizes the phase compensation capacitors of standard operational amplifier configurations as hold capacitors in the hold mode of operation.

2. Description of the Prior Art

The general purpose of track-and-hold amplifiers is to accurately track an analog input signal and, at specified times, to accurately hold at its output for a certain length of time the instantaneous value of the input signal. This form of signal conditioning is particularly important ahead of multi-step analog-to-digital converters, where the quality of conversion is greatly improved by maintaining a substantially constant value at the input of the analog-to-digital converter for any given analog signal. The speed-accuracy product of multistep analog-to-digital conversion can be increased by orders of magnitude with the appropriate sample-and-hold circuitry. Thus, the varying analog signal is tracked and a succession of its values at selected intervals is held constant for conversion to digital representation by the analog-to-digital converter. Track-and-hold and sample-and-hold devices perform essentially the same function, but the sample time is arbitrarily long in the former while it is short and fixed in the latter. Therefore, a track-and-hold device can generally be used as a sample-and-hold apparatus, but not necessarily vice versa.

Conventional track-and-hold circuits typically surround switching circuits and hold capacitors with one or more amplifiers. Within this general description, various topologies have been developed to improve the performance of each circuit for specific applications. For U.S. Pat. No. 3,838,346 to Cox (1974) describes a sample-and-hold circuit designed to be directly responsive to a bipolar input signal without direct current offset utilizing the holding capacitor for low-pass filtering. An operational amplifier and a pair of diodes respond to the input signal and conduct, respectively, when it has a positive slope, while another amplifier and pair of diodes respond and conduct when the input signal has a negative slope. The sampled signal is held on a capacitor for the duration of a holding period and leakage of the capacitor is prevented by the two pairs of diodes that are rendered nonconducting during the holding period.

U.S. Pat. No. 4,370,572 to Cosand et al. (1983) shows a sample-and-hold circuit in which analog signals are processed differentially in order to minimize errors inherent in single-ended processing. The circuit comprises two input amplifiers providing a differential analog signal on a pair of analog signal lines connected to a pair of holding capacitors, a differential output amplifier having inputs coupled to these capacitors and providing a sampled analog output signal, and switching means for selectively coupling the analog signal lines to the pair of holding capacitors. Because of the differential processing of the analog signal, errors due to input currents drawn by the output amplifier are cancelled in a properly balanced circuit, since such currents tend to increase or decrease the charge on both capacitors. Similarly, any switching energy coupled to one of the holding capacitors while in the hold mode tends to be counteracted by a balancing energy coupled to the other holding capacitor.

In U.S. Pat. No. 4,779,012 (1988), Moscovici teaches a track-and-hold amplifier having an additional switching means to add compensatory signals to a second input of an operational amplifier used in the system in order to counteract undesirable effects of the operational amplifier's first input. The result is a circuit with shorter settling times and correspondingly higher conversion frequencies for analog-to-digital apparatus.

U.S. Pat. No. 4,806,790 to Sone (1989) illustrates a sample-and-hold device with a clamping circuit to keep the voltage level of the holding capacitor at a constant value during the hold mode. This is achieved by keeping the base node of the charging transistor at a predetermined value by voltage clamping means operative to cause that transistor to be turned off. Thus, the capacitor supplies a base current only to the driving transistor, thereby decreasing the driftage of voltage at the output node.

Finally, in U.S. Pat. No. 4,845,382 (1989), Eouzan et al. illustrate a sample-and-hold device wherein two identical and parallel sample-and-hold circuits are coupled to a differential amplifier. The signal to be sampled is applied at the input of the first sample-and-hold circuit, while a direct electrical voltage is applied to the input of the other, and both are controlled by the same control pulses. The result is that the sampled signal given at the output of the differential amplifier is a pure signal, net of the interference sampling signals given by the first sample-and-hold circuit.

Thus, there still exists a need for a track-and-hold apparatus with a minimum number of components and low complexity for higher speed, better accuracy, low quiescent power, and low cost implementation. The new topology described herein is directed at attaining these results.

BRIEF SUMMARY OF THE INVENTION

It is therefor an important objective of this invention to provide a track-and-hold circuit of reduced complexity capable of tracking a high frequency signal and of holding it with minimal deterioration during the holding stage.

Another objective of the invention is that it be capable of switching from the tracking to the holding mode at high speed and with low distortion.

Another goal of the invention is a circuit capable of maintaining low output impedance during the holding mode of operation.

A further goal is a track-and-hold apparatus with minimal feed-through to the output while operating in the hold mode.

Another objective of this invention is that the track-and-hold apparatus be suitable for implementation on a semiconductor substrate without additional processing.

Another objective is the development of an operational track-and-hold amplifier with superior performance characteristics which can be used with the standard feedback network configurations generally applicable to standard operational amplifiers.

A further objective of the invention is the ability to apply the same general concept in a variety of designs and physical embodiments to fit the various implementation processes currently known in the art. To that end, the apparatus described herein can be implemented in alternative circuitry obvious to one skilled in the art by the use of bipolar transistors or other equivalent devices, such as junction field-effect transistors, metal-oxide-semiconductor field-effect transistors, or any of the devices generally referred to in the industry as MOS.

Yet another objective of this invention is the realization of the above mentioned goals in an economical and commercially viable manner. This is done by utilizing simple components and methods of manufacture that are either already available in the open market or can be developed at competitive prices.

In accordance with these and other objectives, the track-and-hold circuit of this invention consists of an operational amplifier wherein the same capacitors are used for phase compensation and as differential holding capacitors. The circuit is switched from track to hold by turning off the input stage by reverse biasing base-emitter junctions through current steering in combination with resistor clamping. Low output impedance during the hold mode is maintained because one half of the differential compensation path is connected to the output. Feed-through is eliminated by cascoding the first stage input devices and turning off the cascode devices during the holding mode. The holding capacitor droop due to bias currents is minimized by current cancellation of the second stage.

Various other purposes and advantages of the invention will become clear from its description in the specifications that follow, and from the novel features particularly pointed out in the appended claims. Therefore, to the accomplishment of the objectives described above, this invention consists of the features hereinafter illustrated in the drawings, fully described in the detailed description of the preferred embodiment and particularly pointed out in the claims. However, such drawings and description disclose but one of the various ways in which the invention may be practiced.

DETAILED DESCRIPTION OF THE INVENTION

Figure 1:
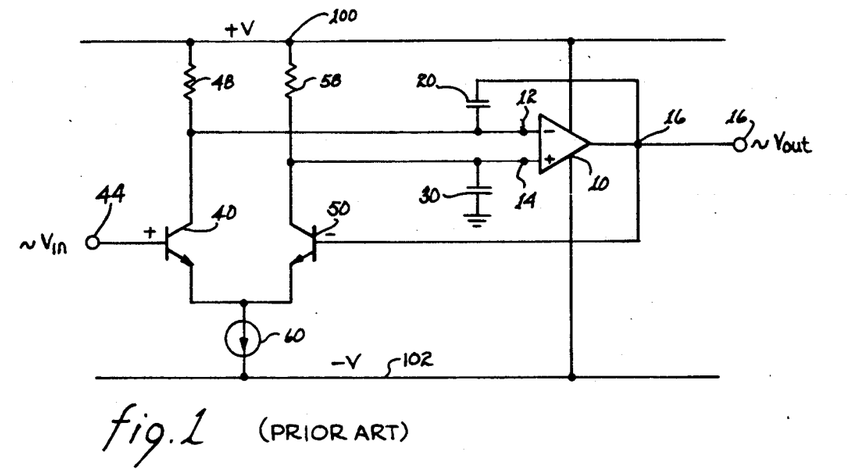
FIG. 1 is a circuit diagram showing a typical configuration of an operational amplifier with phase compensation capacitors.

Referring first to FIG. 1 of the drawings, wherein like parts are designated throughout with like numerals, there is shown a simplified circuit diagram of a typical configuration for an operational amplifier with unity gain. A differential second stage amplifier 10, shown in conventional simplified representation, has a feedback phase compensation capacitance 20 connected between the output node 16 and the operational amplifier's inverting input 12. A second phase compensation capacitor 30 is connected between the non-inverting input 14 and the ground reference voltage G. In order to produce the required phase compensation, the two capacitors 20 and 30 are normally chosen to be substantially equal. A typical input stage of the differential amplifier comprises two resistors 48 and 58, two n-p-n type bipolar transistors 40 and 50, and a current source 60 between a positive ($+V$) power supply rail 100 and a negative ($-V$) power supply rail 102. The base of the first n-p-n type bipolar transistor 40 is connected to an input terminal 44 where a variable analog input signal $V=$ is supplied to the amplifier from an outside source. The collector of the transistor 40 is connected to the positive rail through the resistor 48 and to the inverting input node 12 of the differential second stage 10, while its emitter is coupled to the negative rail through the constant current source 60. The collector of the second n-p-n type bipolar transistor 50 is connected to resistor 58 and to the non-inverting input node 14 of the operational amplifier 10, and its emitter is also coupled to the constant current source 60, while its base is connected to the output of the second stage operational amplifier 10 in direct negative feedback. In use, the two transistors are appropriately biased for linear dynamic operation so that all components are active and the output voltage $V_{out}$ at node 16 closely follows the value of the input voltage $V_{in}$ at terminal 44 because of the 100% feedback connection. Different feedback connections, well known to those skilled in the art, can be used to produce different transfer functions as may be required for particular applications.

Figure 2:
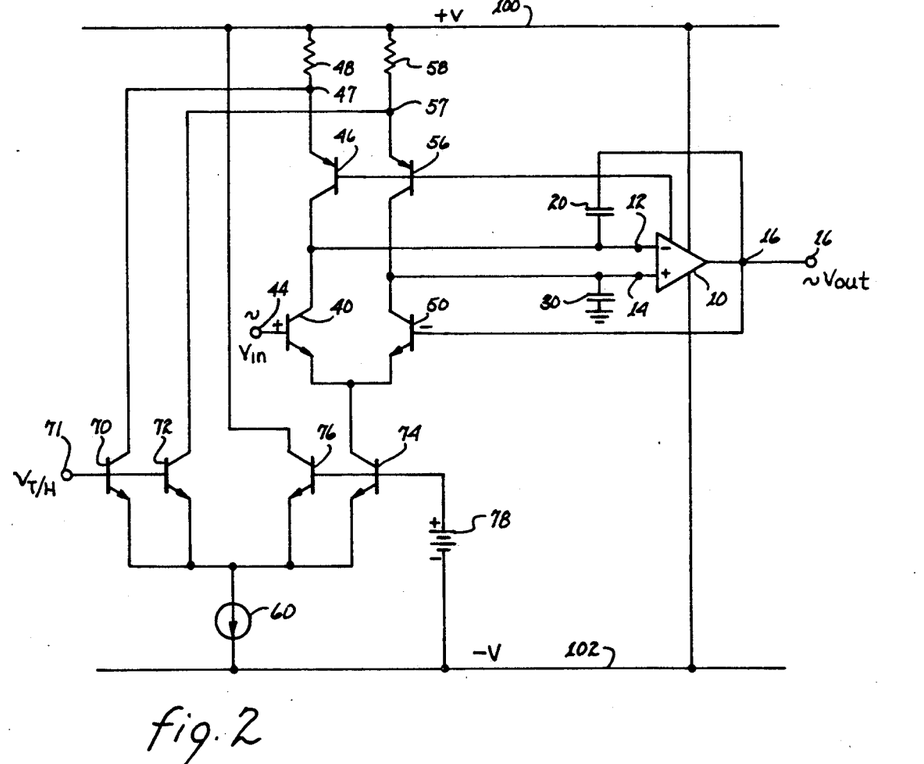
FIG. 2 is a circuit diagram showing a track-and-hold configuration according to the present invention wherein the phase compensation capacitors in the circuit of FIG. 1 are also used as holding capacitors, and wherein the use of current steering and resistor clamping to switch between the track and hold modes of operation is illustrated.

The present invention utilizes the basic circuit of FIG. 1, in conjunction with switching means to isolate the phase compensation capacitors 20 and 30 from the input stage of the amplifier, in order to produce a track-and-hold device. FIG. 2 illustrates a simplified diagram of the circuit topology required to implement this concept, wherein the input stage is turned off by the use of current steering and resistor clamping. The flow of current through the first stage is controlled by a set of n-p-n bipolar transistors 70, 72, 74 and 76 coupled to the negative voltage power supply rail 102 through the constant current source 60. The collector of transistor 74 is connected to the emitters of the first stage transistors 40 and 50 and its base is held at a forward biasing voltage by the constant threshold voltage source 78. The collectors of transistors 40 and 50 are further coupled, to the collectors of p-n-p bipolar transistors 46 and 56, respectively, whose emitters in turn are connected through nodes 47 and 57 to resistors 48 and 58, respectively, and then to the positive voltage line 100. The base nodes of transistors 46 and 56 are coupled to and driven by the common emitter node (shown in FIG. 4 as node 86) in the differential second stage 10. The collector of transistor 76, whose emitter is forward biased by the same constant voltage source 78 driving transistor 74, is connected directly to the positive voltage rail 100, while its emitter is connected to the constant current source 60. Thus, a portion of the current from current source 60 flows through transistor 74 and the remainder through transistor 76. Finally, both branches of the input stage are also connected through nodes 47 and 57 to the current source 60 through two n-p-n bipolar transistors 70 and 72, respectively, which are driven by a control input $V_{T/H}$ affecting their base voltage.

From FIG. 2 it can be seen that when the control signal $V_{T/H}$ at node 71 is low with respect to the voltage source 78, the two n-p-n bipolar transistors 70 and 72 are reverse biased and the operative circuit reduces to the one shown in FIG. 1 with the additional throw-away current path through transistor 76, wherein a portion of the current through current source 60 is steered through the first stage of the amplifier and the apparatus operates in the tracking mode. Thus, the output signal $V_{out}$ at terminal 16 tracks the input signal $V_{in}$ at terminal 44. When the control signal $V_{T/H}$ is high, transistors 70 and 72 are turned on causing their emitter voltage to increase which, in turn, causes transistors 74 and 76 to be turned off and interrupt the current flow through the first state of the apparatus. The result is that the total current steered through transistors 70 and 72 equals the current previously flowing through transistors 74 and 76, and the sum of the currents through resistors 48 and 58 increases by an amount equal to the throw-away current previously flowing through transistor 76. This added current pulls down the voltages at nodes 47 and 57 and, therefore, also pulls down the emitter terminals of p-n-p bipolar transistors 46 and 56, while their base voltages are held by capacitors 20 and 30, so that these transistors are turned off as well. In this condition the second state, including capacitors 20 and 30, of the track-and-hold device is isolated from the input and the apparatus operates in the hold mode. The signal appearing at the output terminal 16 is equal to the voltage accumulated during the track mode operation in the phase compensation capacitors 20 and 30, which are now functioning as holding capacitors. Ideally, these capacitors would hold that voltage constant during the entire hold period for conversion to digital form or any other downstream application. In practice, capacitor droop and AC feed-through would cause the output voltage to change during the hold period.

Figure 3:
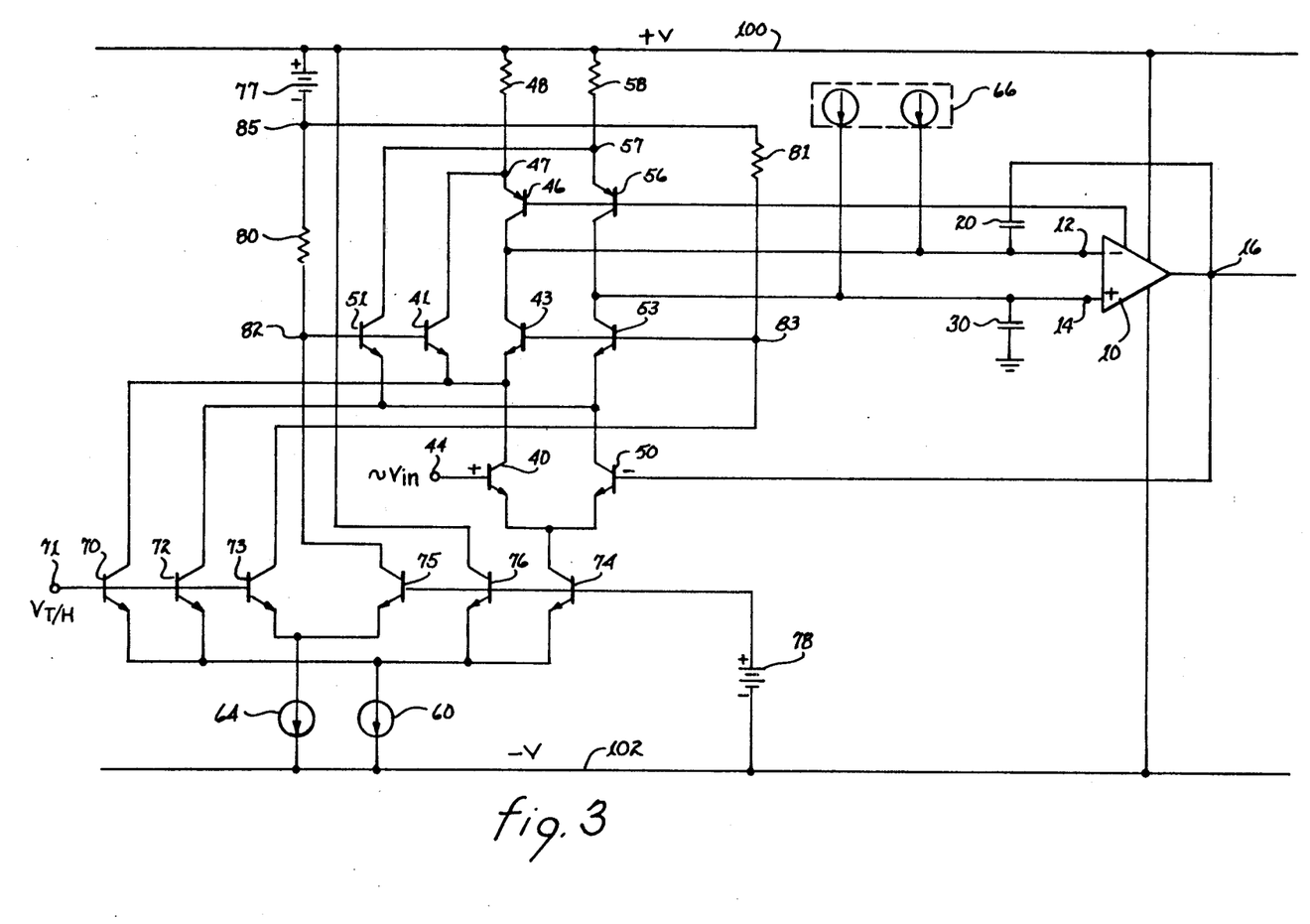
FIG. 3 shows a more complete schematic diagram of the operational track-and-hold apparatus of this invention illustrating the use of cascode devices in the signal path and the circuitry used to switch them off to avoid feed-through in the hold mode.

In order to minimize feed-through in the hold mode, a cascoded input stage of n-p-n bipolar transistors is utilized, as shown in FIG. 3. Transistors 43 and 53 are cascoded between the collector terminals of transistor 40 and transistor 50, respectively, and the corresponding collector terminals of transistors 46 and 56. These track-mode cascode devices of the input stage are provided to isolate the second stage, by turning them off during the hold period, from the feed-through resulting from the capacitive coupling of the input signal through transistors 40 and 50. In order to switch the track-mode cascode transistors 43 and 53 on and off between track and hold modes, respectively, the base voltage of these devices is controlled by current steering with resistor clamping circuitry. Accordingly, as shown in FIG. 3, two n-p-n bipolar transistors 41 and 51 are added to the circuit between nodes 47 and 57 and transistors 70 and 72, respectively, and are emitter coupled to transistors 43 and 53 in order to provide alternate, hold-mode cascode devices during the holding period. A constant voltage source 77 from the positive voltage rail 100 is connected, through substantially equal resistors 80 and 81, to nodes 82 and 83, respectively, which are in turn coupled to the bases of cascode transistor pairs 41 and 51, and 43 and 53, respectively. Nodes 82 and 83 are coupled to the collector terminals of n-p-n bipolar transistors 75 and 73, respectively, which feed the constant current source 64 connected between their emitter terminals and the negative voltage rail 102. As would be apparent to one skilled in the art, when the control voltage $V_{T/H}$ is low and transistor 73 is turned off, the voltage at node 83 is held at a forward biasing level by the constant voltage source 77, while the voltage at node 82 is kept low by the constant voltage source 77 plus the voltage drop through resistor 80 caused by the current flowing through transistor 75, which is forward biased by the constant voltage source 78. When $V_{T/H}$ is high, transistors 73 and 75 are on and off respectively, causing the current through node 85 to be steered away from resistor 80 and into resistor 81, with a corresponding voltage increase at node 82 and at the base of the hold-mode cascode transistor pair 41 and 51, and a voltage decrease at node 83 and at the base of the track-mode cascode transistor pair 43 and 53. Thus, as the control signal $V_{T/H}$ goes high to switch to the hold mode, the hold-mode cascode transistors 41 and 51 are turned on to close the connection between nodes 47 and 57 and their respective switch devices 70 and 72, so that the voltage at nodes 47 and 57 can be pulled down as explained above. At the same time, the decrease in voltage at node 83 turns off the track-mode cascode transistors 43 and 53, which substantially isolates capacitors 20 and 30 and the second stage from feed-through of the input signal in the hold mode.

As shown in schematic form in FIG. 3, bias current cancellation networks 66 are also provided, by means well known to those skilled in the art, at the input of the second stage of the apparatus in order to reduce the droop rate of capacitors 20 and 30 due to the input bias currents in the second stage. This is desirable because capacitor droop causes output error due to common-mode gain of the second stage. Bias current cancellation is commonly used on the input stage of bipolar transistor operational amplifiers in order to reduce input stage bias currents. In this invention it is used at the second stage to control capacitor droop. Thus, when the circuit is switched from track to hold, the input stage is turned off and the capacitors preserve the differential input voltage of the second stage. Therefore, the output of the amplifier is held at its value at the instant of the switch.

Figure 4:
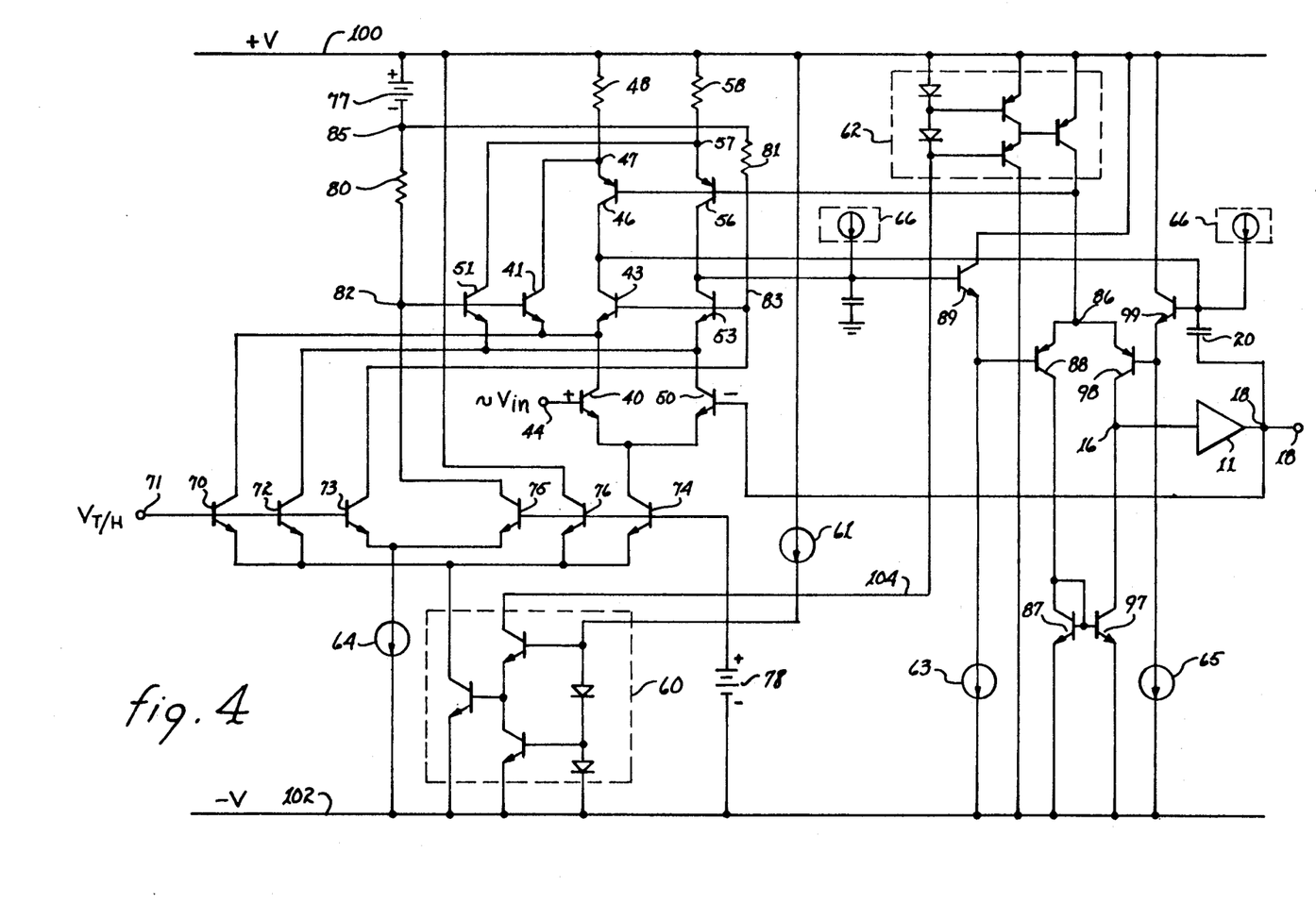
FIG. 4 shows a yet more detailed schematic diagram of the embodiment of the invention of FIG. 3, including second stage bias current cancellation and a feedback loop from the negative rail bias line to the positive rail bias line for improved settling time and distortion.

FIG. 4 shows a more detailed circuit diagram of the operational track-and-hold amplifier of this invention using switching by reverse biasing of base-emitter junctions, which result in low parasitic capacitance and high speed switching. The corresponding track-and-hold apparatus has very few components in the signal path, which results in simple and low cost implementation, low quiescent power requirements, high speed response, and exceptional accuracy. When compared to track-and-hold devices of conventional design, the apparatus of this invention demonstrated impressive performance characteristics, with several orders of magnitude improvements in the areas of linearity, common-mode rejection, power supply rejection, distortion, feed-through, and settling time. As represented in the diagram of FIG. 4, the amplifier stage 10 of FIG. 3 consists of a second stage and an output stage. The second stage consists of p-n-p, bipolar transistors 88 and 98, actively loaded by the n-p-n bipolar transistor mirror devices 87 and 97, respectively. The common emitter node 86 of transistors 88 and 98 is coupled to the base terminals of transistors 46 and 56 to provide a biasing feedback loop during the tracking mode. Transistors 88 and 98 are driven by the emitter-follower n-p-n bipolar transistors 89 and 99, respectively, which in turn are driven by the input stage. An additional buffer stage 11 is added to the network between the output of the second stage at node 16 and the operational track-and-hold amplifier's output at node 18. The output signal at node 18 is fed back directly to the negative input terminal of the input stage (but other feedback arrangements are obviously possible, as mentioned below). The output node is also coupled with one half of the differential compensation, capacitor 20, in order to close the feedback loop during the hold mode to maintain low output impedance. As mentioned above, current cancellation networks 66 for the emitter-follower transistors 89 and 99 are used to reduce droop rate during the holding period.

Figure 5:
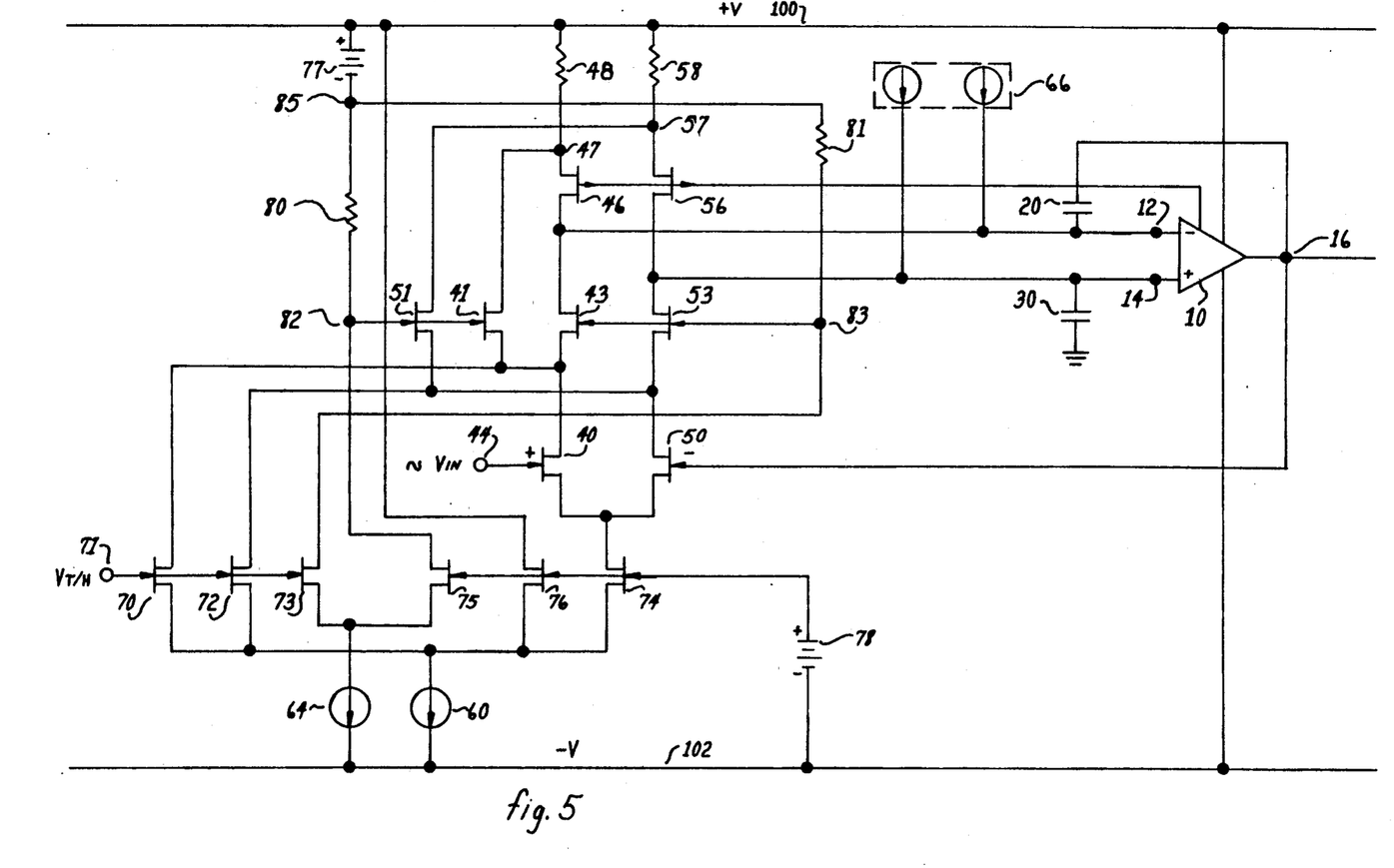
FIG. 5 shows an embodiment of the schematic diagram of FIG. 3 implemented with junction field-effect transistors.
Figure 6:
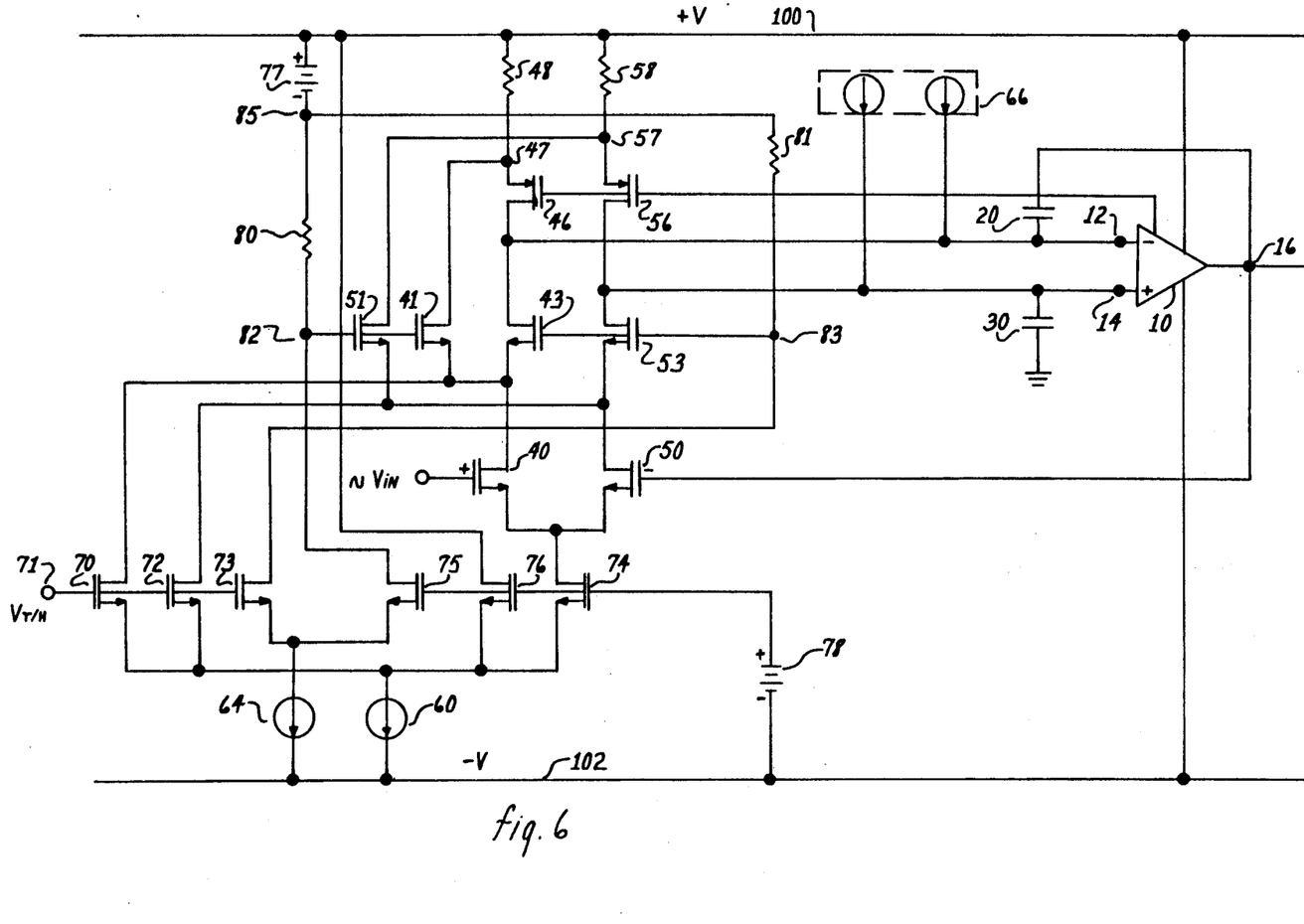
FIG. 6 shows an embodiment of the schematic diagram of FIG. 3 implemented with metal-oxide semiconductor field-effect transistors.

During the process of optimizing the biasing circuitry of the invention, it was surprisingly discovered that a low impedance negative rail bias line with feedback to the positive rail bias line results in better transient response and lower distortion. FIG. 4 illustrates the feedback line 104 between the negative rail bias network for the constant current source 60 and the positive rail bias network for the current source 62, which produced distinctly improved performance in the apparatus. Finally, current sources 61, 63 and 65 are illustrated in schematic form to complete the diagram, as would be obvious to those skilled in the art. It is understood that many equivalent detailed circuit designs are possible within the scope of the present invention, with corresponding modifications to handle the current levels and parameter match requirements for proper functioning of the circuit. The architecture of the electronic circuitry described herein is suitable for monolithic fabrication and can be assembled in its entirety using currently available components. On the other hand, those skilled in the art could easily design circuits to practice the invention with alternative components, such as field-effect transistors, as shown in FIG. 5 and metal-oxide-semiconductor field-effect transistors, as shown in FIG. 6, or any equivalent such as transistors generally referred to as MOS in the industry.

The topology of the present invention produces an operational track-and-hold amplifier of excellent characteristics that can be used either as a track-and-hold device or as a traditional operational amplifier. Accordingly, it is suitable for adaptation, according to known principles, to produce various transfer functions including inverting amplification, non-inverting amplification, summing, differentiating, integrating, and any other configuration used with conventional operational amplifiers.

Thus, various changes in the details, steps and materials that have been described may be made by those skilled in the art within the principles and scope of the invention herein illustrated and defined in the appended claims. While the present invention has been shown and described herein in what is believed to be the most practical and preferred embodiment, it is recognized that departures can be made therefrom within the scope of the invention, which is therefore not to be limited to the details disclosed herein, but is to be accorded the full scope of the claims so as to embrace any and all equivalent apparatus and methods.

We claim:

1. An operational track-and-hold amplifier circuit switchable between a tracking mode of operation, wherein the output signal of said amplifier tracks an analog input signal, and a holding mode, wherein said output signal holds its value on command, comprising:
    (a) a differential input stage to which said analog input signal is applied;
    (b) a differential second stage, having internal differential phase compensation capacitance consisting of one capacitance connected to each input of said differential second stage, from which said output signal is obtained and fed back to said input stage; and
    (c) switching means for turning off said input stage, thereby operating said amplifier in the hold mode and using said differential phase compensation capacitance as differential holding capacitance to hold said output signal on command.

2. The amplifier circuit defined in claim 1, wherein said switching means for turning off said input state comprises bipolar transistor junctions that are reverse biased to switch said amplifier circuit to the hold mode.

3. The amplifier circuit defined in claim 2, wherein said bipolar transistor junctions are reverse biased through current steering.

4. The amplifier circuit defined in claim 3, wherein said bipolar transistor junctions are reverse biased through current steering with resistor clamping.

5. The amplifier circuit defined in claim 4, further comprising:
    (d) input state track-mode cascode devices and means for switching off said track-mode cascode devices in the holding mode to attenuate feed-through.

6. The amplifier circuit defined in claim 5, further comprising:
    (e) input state hold-mode cascode devices and means for switching on said hold-mode cascode devices in the holding mode to further attenuate feed-through.

7. An operational track-and-hold amplifier circuit switchable between a tracking mode of operation, wherein the output signal of said amplifier tracks an analog input signal, and a holding mode, wherein said output signal holds its value on command, comprising:
    (a) a differential input stage to which said analog input signal is applied;
    (b) a differential second stage, having internal differential phase compensation capacitance, from which said output signal is obtained and fed back to said input stage;
    (c) switching means for turning off said input stage, thereby operating said amplifier in the hold mode and using said differential phase compensation capacitance as differential holding capacitance to hold said output signal on command; and
    (d) input stage track-mode cascode devices and means for switching off said track-mode cascode devices in the holding mode to attenuate feed-through.

8. The amplifier circuit defined in claim 7, further comprising:
    (e) input stage hold-mode cascode devices and means for switching on said hold-mode cascode devices in the holding mode to further attenuate feed-through.

9. The amplifier circuit defined in claim 8, wherein said track-mode and hold-mode cascode devices comprise bipolar transistor junctions and said means for switching off said track-mode cascode devices and for switching on said hold-mode cascode devices in the holding mode to attenuate feed-through consists of reverse biasing the base-emitter junctions of said track-mode cascode devices and at the same time forward biasing the base-emitter junctions of said hold-mode cascode devices.

10. The amplifier circuit defined in claim 9, wherein said reverse biasing of the base-emitter junctions of said track-mode cascode devices and contemporaneous forward biasing of the base-emitter junctions of said hold-mode cascode devices during the holding mode is accomplished through current steering.

11. The amplifier circuit defined in claim 10, wherein said reverse biasing of the base-emitter junctions of said track-mode cascode devices and contemporaneous forward biasing of the base-emitter junctions of said hold-mode cascode devices during the holding mode is accomplished through current steering with resistor clamping.

12. The amplifier circuit defined in claim 8, wherein said switching means for turning off said input stage and said track-mode and hold-mode cascode devices comprise junction field-effect transistors that are turned off by current steering with resistor clamping.

13. The amplifier circuit defined in claim 8, wherein said track-mode and hold-mode cascode devices comprise metal-oxide semiconductor field-effect transistors and said means for switching off said track-mode cascode devices and for switching on said hold-mode cascode devices in the holding mode to attenuate feed-through consists of turning off the gate-to-source junctions of said track-mode cascode devices and at the same time turning on the gate-to-source junctions of said hold-mode cascode devices.

14. The amplifier circuit defined in claim 8, wherein said switching means for turning off said input stage comprises bipolar transistor junctions that are reverse biased to switch said amplifier circuit to the hold mode, and wherein said bipolar transistor junctions are reverse biased through current steering with resistor clamping.

15. The amplifier circuit defined in claim 14, wherein said track-mode and hold-mode cascode devices comprise bipolar transistor junctions and said means for switching off said track-mode cascode devices and for switching on said hold-mode cascode devices in the holding mode to attenuate feed-through consists of reverse biasing the base-emitter junctions of said track-mode cascode devices and at the same time forward biasing the base-emitter junctions of said hold-mode cascode devices through current steering with resistor clamping.

16. The amplifier circuit defined in claim 15, further comprising:
   (f) means for providing bias current cancellation in said second stage in order to minimize droop in said holding capacitance due to biasing current in second stage devices.

17. The amplifier circuit defined in claim 16, further comprising:
   (g) a feedback loop between a low impedance negative rail bias line in said differential input stage and a positive rail bias line in said differential second stage.

* * * * *